United States Patent [19]

Yamada

[11] Patent Number: 6,014,754
[45] Date of Patent: Jan. 11, 2000

[54] SIGNAL RECORDING AND REGENERATING APPARATUS AND ERROR RECOVERY PROCESSING EXECUTION SEQUENCE CHANGE METHOD

[75] Inventor: Shuji Yamada, Fujisawa, Japan

[73] Assignee: International Business Machines Corporation, Armonk, N.Y.

[21] Appl. No.: 08/973,300

[22] PCT Filed: Jun. 29, 1995

[86] PCT No.: PCT/JP95/01316

§ 371 Date: Dec. 2, 1997

§ 102(e) Date: Dec. 2, 1997

[87] PCT Pub. No.: WO97/01842

PCT Pub. Date: Jan. 16, 1997

[51] Int. Cl.[7] .................................................. G06F 11/00
[52] U.S. Cl. ............................... 714/5; 714/15; 714/48
[58] Field of Search ............................ 714/15, 6, 5, 16, 714/2, 7, 20, 21, 44, 48, 49, 52, 723, 752, 758, 763, 768, 764; 360/53

[56] References Cited

U.S. PATENT DOCUMENTS

| | | | |
|---|---|---|---|
| 4,516,165 | 5/1985 | Cunningham et al. | 360/53 |
| 4,701,915 | 10/1987 | Kitamura et al. | 714/6 |
| 4,800,563 | 1/1989 | Itagaki et al. | 714/6 |
| 4,821,125 | 4/1989 | Christensen et al. | 360/31 |
| 4,866,712 | 9/1989 | Chao | 371/5.1 |
| 5,269,017 | 12/1993 | Hayden et al. | 714/15 |
| 5,293,613 | 3/1994 | Hayden et al. | 714/15 |
| 5,325,364 | 6/1994 | Ouchi et al. | 714/5 |
| 5,331,476 | 7/1994 | Fry et al. | 360/53 |
| 5,379,162 | 1/1995 | Cunningham et al. | 360/53 |
| 5,386,324 | 1/1995 | Fry et al. | 360/53 |
| 5,421,003 | 5/1995 | Escola et al. | 714/16 |

FOREIGN PATENT DOCUMENTS

| | | | |
|---|---|---|---|
| 0077007A2 | 4/1983 | European Pat. Off. | G06F 3/06 |
| 0339874A2 | 11/1989 | European Pat. Off. | G11B 19/04 |
| 0447246A2 | 9/1991 | European Pat. Off. | G11B 5/012 |
| 0458556A2 | 11/1991 | European Pat. Off. | G06F 11/00 |
| 0510834A2 | 10/1992 | European Pat. Off. | G06F 15/419 |
| 0639825A1 | 2/1995 | European Pat. Off. | G11B 5/012 |
| 58-224416 | 12/1983 | Japan . | |
| 60-136961 | 7/1985 | Japan . | |
| 6-231410 | 8/1994 | Japan . | |
| 7-065313 | 3/1995 | Japan . | |
| 7-085609 | 3/1995 | Japan . | |

OTHER PUBLICATIONS

"Invoking Error Recovery Procedures", IBM Technical Disclosure Bulletin, vol. 24, No. 8, Jan. 1982, pp. 4051–4052.

Primary Examiner—Joseph E. Palys
Assistant Examiner—Rijue Mai
Attorney, Agent, or Firm—Matthew J. Bussan

[57] ABSTRACT

The present invention relates to efficient execution of signal read error recovery processing in a signal recording and regenerating apparatus. A table is used to define the execution sequence of a plurality of error recovery processings, one structure is assigned to the table correspondingly to each error recovery processing, and an address for calling a corresponding error processing and moreover and a structure address corresponding to an error recovery processing to be executed before and after the present structure are included in each structure. By rewriting the address of the previous and forward structures by the LRU method or the weighting method, it is possible to change the chained relation between structures and more quickly execute the optimum error processing.

7 Claims, 7 Drawing Sheets

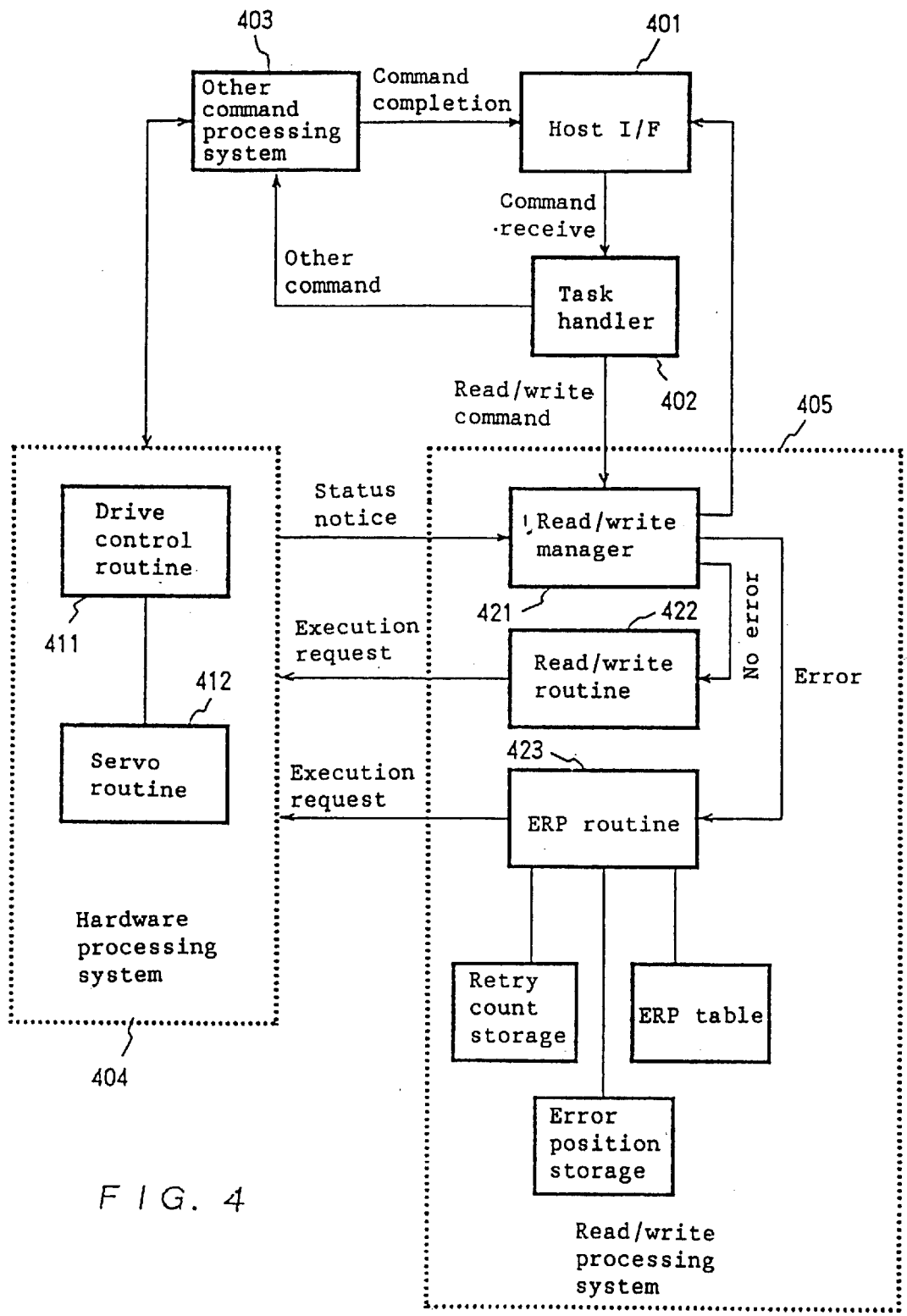
F I G. 4

SIGNAL RECORDING AND REGENERATING APPARATUS AND ERROR RECOVERY PROCESSING EXECUTION SEQUENCE CHANGE METHOD

BACKGROUND OF THE INVENTION

1. Field of the Invention

The present invention relates to the field of produced error processing in a magnetic disk drive. More particularly, the present invention relates to a method for realizing the optimum execution form of an error recovery procedure (ERP) and its system.

2. Background Information

A magnetic disk drive is an apparatus for recording data in accordance with magnetic changes of the surface of a disk and reading the data. A transducer head serving as a converter is positioned at a predetermined position of a track with data recorded and reads information recorded in tracks of a disk rotating at a high speed or writes information in the tracks. If any error occurs when data is read by the head, it is hitherto known that there are various error recovery procedures (ERPs) for recovering the error.

A read error occurs in a disk due to scratches, unevenness of a magnetic body, or change of the magnetic body with time which are not found while the disk is manufactured. A general error recovery code ECC is used for an error normally caused in a data part and error recovery processing. Moreover, when a read gain or an off-track is changed or an MR (magnetic-resistance) element is used as a read head, various recovery processings are executed including the change of a bias value of the MR element. When these recovery processings are executed and data is reread, the data is continuously used. However, when an error cannot be recovered by a plurality of error recovery processings, the error is classified as a hard error. Or, when it is possible to rerecord (reassign) data in other area, the data is rerecorded in other area by setting the area concerned on the disk as an unusable area.

A magnetic-resistance (MR) conversion head is used as one of the existing conversion heads. In the case of the magnetic-resistance conversion head, the output resistance of the head changes in accordance with the change of a magnetic field. The resistance change is converted to a DC voltage signal by flowing a predetermined current to an MR element and data read is executed.

However, the method for reading a resistance change includes a thermal asperity as one of the read errors. The thermal asperity is defined as a phenomenon in which a protrusion formed on a disk collides with a read head to cause a resistance change in an MR element due to a temperature change and thereby, an abnormal signal is generated.

The thermal asperity is not found in manufacturing a disk but it frequently occurs while a system is operated and measures have not completely been taken for the error in most cases.

Not only the thermal asperity but also various error factors can always be present. Therefore, it is requested to execute error recovery processing steps for solving these various errors.

In the case of error recovery processing, it is general to change or adjust standard read conditions specified between a disk, magnetic head, and HDC (hard disk controller) one by one and reread data. Read conditions include an off-track value which is a deviation of the center of a magnetic head from that of a track, a bias current value supplied to an MR element when the magnetic head uses the MR element, and the speed of a PLL circuit for stabilizing a signal amplification factor and a sampling frequency by means of auto gain control (AGC) for making the amplitude of a regenerative signal constant (tracking speed is set to a predetermined value).

When an error occurs, these conditions are changed, that is, the tracking characteristic is intentionally deteriorated, the amplification factor of the auto gain control (AGC) for signal amplification is adjusted, and data is sequentially reread. When data read is successfully completed, the error recovery processing terminates.

The execution sequence of a lot of processings included in the error recovery processing routine is fixed. That is, the execution sequence such as firstly, adjustment of AGC, secondly, adjustment of PLL, and thirdly, change of bias value of MR head is not changed after it is determined when constituting a system. Therefore, when a procedure to be actually recovered is present at the end of the recovery processing routine, unnecessary recovery processing and reread are repeatedly executed to cause the error recovery processing efficiency to decrease.

SUMMARY OF THE INVENTION

It is an object of the present invention to provide an apparatus and a method for more efficiently executing the error recovery processing executed when an error occurs in reading signals on a disk.

It is another object of the present invention to provide means and a method for changing a plurality of error recovery processing steps executed for error recovery processing to the optimum sequence.

BRIEF DESCRIPTION OF THE DRAWINGS

FIG. 4 is a block diagram of a system for error recovery procedures and change of its execution sequence;

DESCRIPTION OF THE PREFERRED EMBODIMENT

Figure 1:
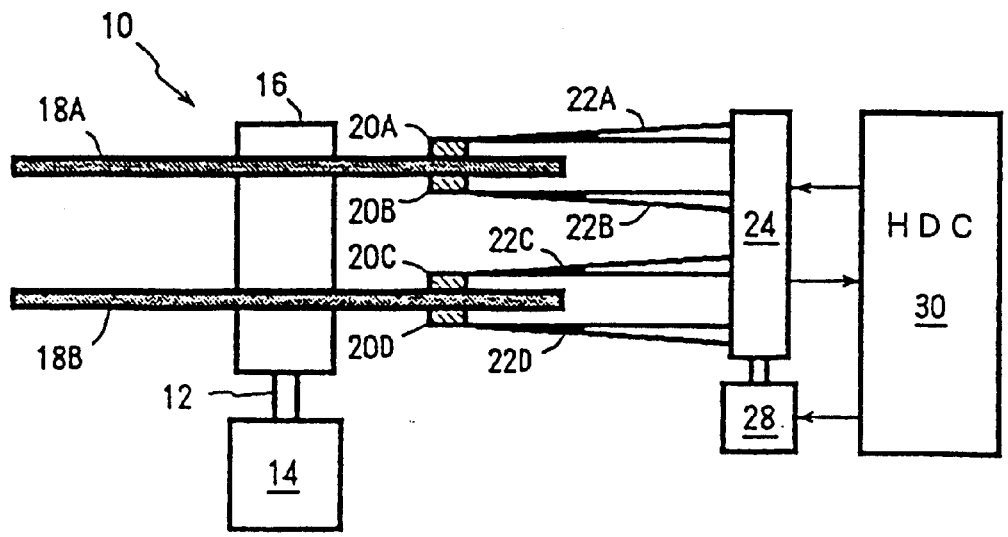
FIG. 1 is a block diagram of a hard disk drive to which the present invention is applied.

FIG. 1 is an example of a hard disk drive (HDD) to which the present invention is applied. As shown in FIG. 1, a disk drive 10 comprises a disk section and a hard disk controller (HDC) 30 provided with a local CPU. The disk section is provided with a disk drive 14 for rotating a shaft 12 at a high speed. A cylindrical support 16 is set to the shaft 12 so that the axis of the support 16 coincides with that of the shaft 12 and one or more information recording disks 18A and 18B are set on the outer periphery of the support 16 at a predetermined interval.

When the shaft 12 is rotated by the disk drive 14, the disks 18A and 18B rotate together with the support 16.

Signal converters 20A, 20B, 20C, and 20D are arranged so as to face the disks by being supported by access arms 22A, 22B, 22C, and 22D. The access arms 22A to 22D are set to a signal converter drive 28 through a shaft 24 and the signal converters 20A to 20D are located at predetermined positions of a disk as the shaft 24 rotates. The disk drive 14 and the signal converter drive 28 are connected to the HDC 30 and their rotational speed and operational speed are controlled. The HDC 30 can be connected to a host.

Data tracks are concentrically formed on a magnetic disk such as a hard disk or flexible disk. Information is written in or read from a magnetic disk by rotating the magnetic disk and moving a magnetic head almost along the diametric direction of the magnetic disk to position it to a specific data track (this is so-called seeking). The magnetic disk is positioned to a specific data track by reading head position identifying information previously recorded in the magnetic disk with a magnetic head.

In this case, one of the information read errors on the disk may be caused by missing of information which is data. It is known that the missing of information is frequently caused by a scratch produced in accordance with elapse of time or a damage due to the change of a magnetic body with time. To read information from a disk, standard read conditions are normally determined between the disk, a magnetic head, and an HDC (hard disk controller). These read conditions include setting an off-track value which is a deviation of the center of the magnetic head from that of a track to a predetermined value, setting a bias current supplied to an MR element to a predetermined value when the magnetic head uses the MR element, making a signal amplification factor variable by means of auto gain control (AGC) in order to keep the amplitude of a regenerative signal constant, and making the speed of a PLL circuit for stabilizing a sampling frequency constant (tracking speed is set to a predetermined value).

When read is executed in accordance with these predetermined read conditions and an error occurs, error recovery is executed by intentionally deteriorating the tracking characteristic or maintaining the amplification factor of auto gain control (AGC) for signal amplification and thereby executing reread.

As described above, the present invention improves a hit rate by a faster execution sequence, that is, an error recovery success rate by making the execution sequence of error recovery procedures in an error recovery routine including a plurality of processings for error recovery variable.

Figure 2:
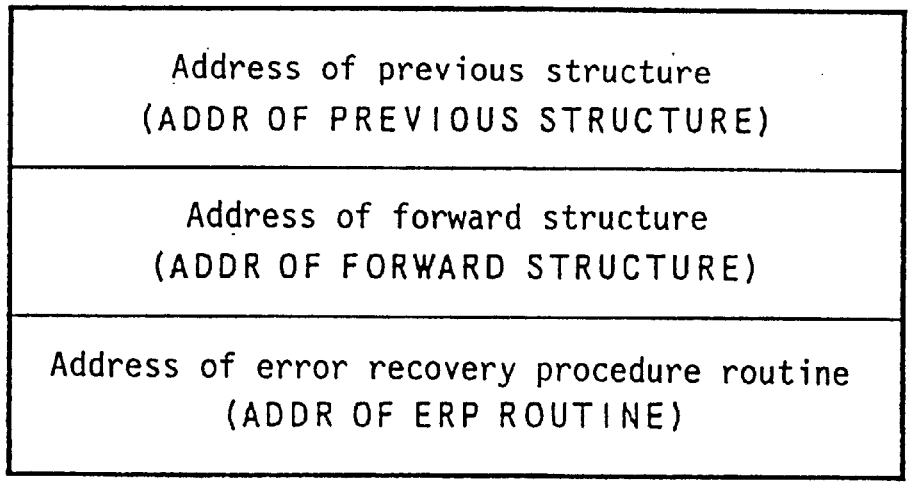
FIG. 2 is an illustration showing a structure recorded in a table having the address of an error recovery procedure.

To adjust the execution sequence of error recovery procedures (ERP), the present invention has a table with a chained structure. FIG. 2 shows the configuration of a structure constituting the table. The structure has the address of a structure to be executed immediately before the present structure (ADDR. OF PREVIOUS STRUCTURE), the address of a structure to be executed immediately after the present structure (ADDR. OF FORWARD STRUCTURE), and the address for calling an error processing routine to be actually executed (ADDR. OF ERP ROUTINE).

Figure 3:
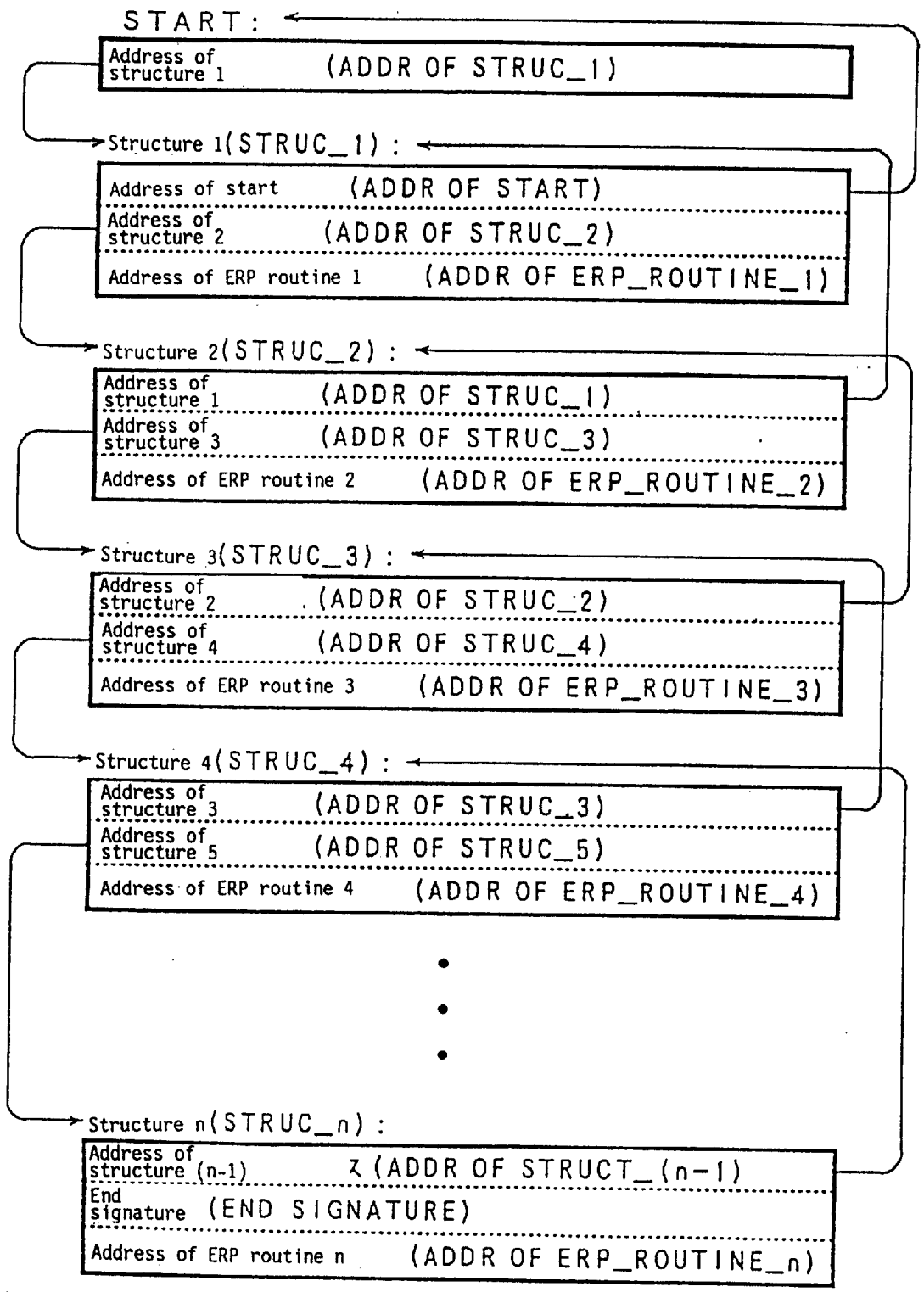
FIG. 3 is an illustration showing a chain of structures in a table having the address of an error recovery procedure.

These structures are chained in the table. FIG. 3 shows the chained structures. Each structure corresponds to one error recovery procedure. That is, each structure has the address of a corresponding error recovery procedure to be executed and the procedure of the address owned by the structure is executed. Each structure has the addresses of the structures before and after the present structure. These addresses are addresses for chaining a plurality of structures in the table, which make it possible to immediately retrieve the next structure from the present structure. Each procedure is called and executed in accordance with the chain and the address of the error recovery procedure owned by each structure. Therefore, the execution sequence of a plurality of procedures is determined by the chained relation between these structures. The chained relation between a plurality of structures in the table is determined by the previous address (ADDR. OF PREVIOUS STRUCTURE) and the forward address (ADDR. OF FORWARD STRUCTURE) of each structure in the table. That is, the chained relation is changed by rewriting the previous and forward addresses and thereby, the execution sequence of error recovery procedures can be changed.

FIG. 4 shows a block diagram of a system related to error recovery procedures and change of the execution sequence of the procedures. A host I/F 401 for controlling the communication with a host system receives commands from the host system and sends the commands to a task handler 402. The task handler 402 classifies the commands into read/write commands and other commands in accordance with the type of a command and sends the read/write commands to a read/write command processing system 405 and other commands to an other command processing system 403.

A hardware processing system 404 is a system for controlling hardware, which is provided with a drive control routine 411 for controlling a hard disk controller (HDC) and a read/write channel and a servo routine 412 for controlling a servo system.

Read/write of a HDD (hard disk drive) requires the following operations: (a) interpreting a command and detecting a physical location of data to be read or written, (b) setting an actuator to the physical location (seek), (c) executing read/write of data, and (d) seeking the next track when a track ends in the middle of data and executing read/write of remaining data. The read/write processing system 405 processes commands sent from the task handler 402 while judging these situations.

A read/write manager 421 is a routine for judging a situation and controlling which routine should be executed next. A read/write routine 422 is a routine for actually executing an execution routine determined by the read/write manager 421, which sends an actual operation execution request following an execution routine to the hardware processing system 404. An actual operation is executed in accordance with the operation execution request and its result is notified to the read/write manager as a status notice. When it is notified that processing terminates without error, the read/write manager 421 starts the next operation. When command processing is completed in accordance with a series of the flows, results are notified to the host through the host I/F 401.

If an error occurs during a series of these processings, the read/write manager 421 urges an ERP routine 423 to start execution of ERPs (error recovery procedures). The ERP routine 424 receives a place where an error occurs (physical location) from the read/write manager 421, executes a predetermined error recovery processing about the place and restarts the normal operation when the error is recovered.

The ERP routine 423 stores the last retry position and the retry count showing the number of retry repetitions, in which the retry count is increased every retry for an error at the same position. The ERP routine 423 has an ERP table and predetermined error recovery procedures stored in the table are sequentially executed. Unless an error is recovered by a procedure, the retry count is incremented (increased) by 1 to execute the next error recovery procedure in accordance with the sequence stored in the table. By writing the sequence of error recovery procedures recorded in the ERP table (by changing the chained relation between structures), it is possible to change the execution sequence of ERPs.

Figure 5:
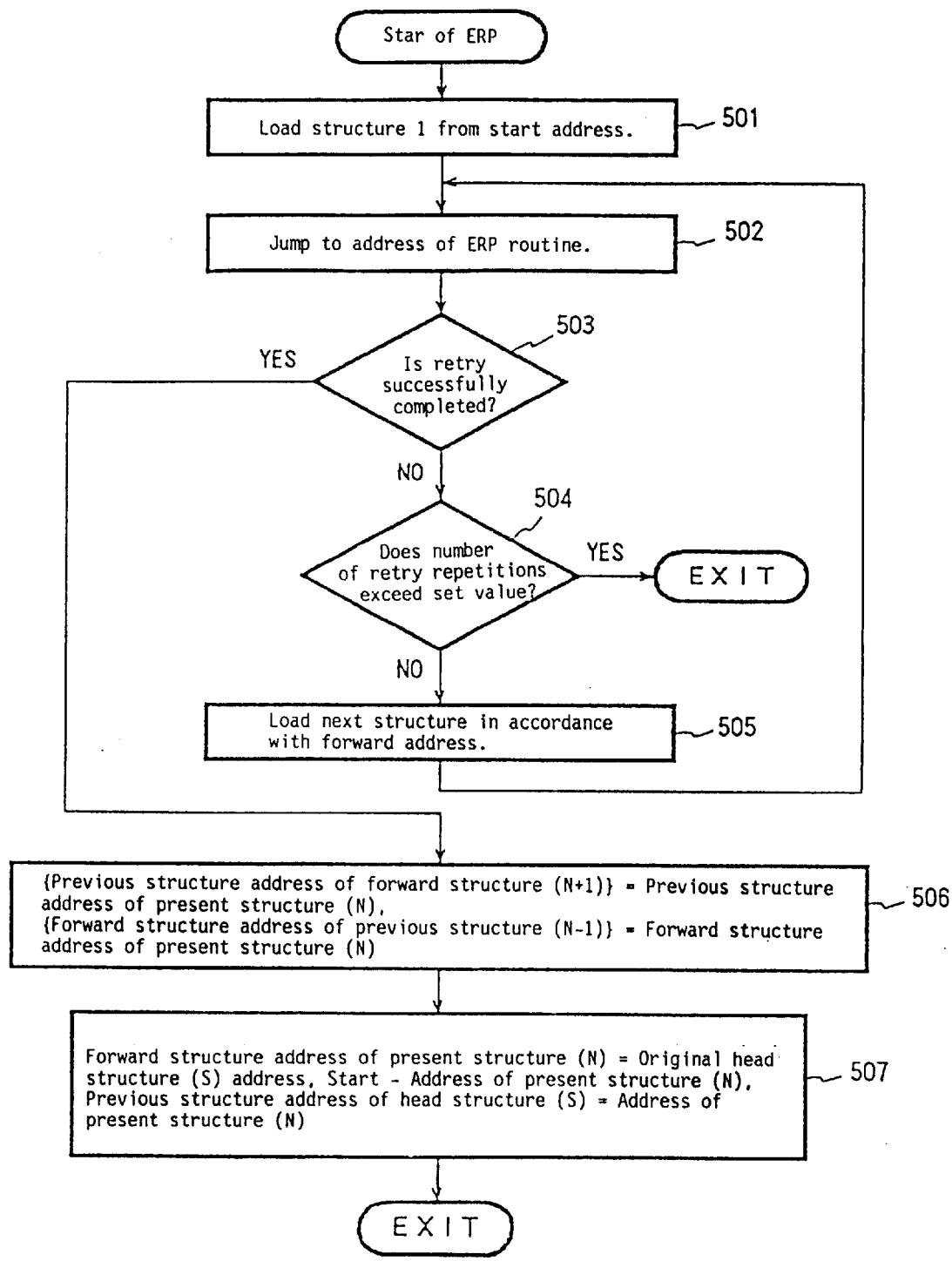
Fig. 5 is an illustration showing the flow for executing an error recovery procedure and rewriting the procedure execution sequence in accordance with the LRU method.

FIG. 5 shows a flow chart of a module for changing the execution sequence of ERP routines in accordance with the LRU (Least Recently Used) method. In step 501, the first structure is called from the table in order to start an error recovery procedure. Then, in step 502, an actual error recovery procedure is called by using the address of the error recovery procedure recorded in the first-called structure and executed. In step 503, read is executed again during the execution of the actual error recovery procedure and it is judged whether the read is successfully completed. In step 504, it is judged whether the number of retry repetitions does not exceed a preset value. When the number of retry repetitions does not exceed the preset value, the program advances to step 505 to call the next structure, that is, a chained structure in accordance with the next address recorded in a structure in order to execute the next error recovery procedure, then returns to step 502 to execute the next error recovery procedure and thereafter repeats the same step. The program repeats a plurality of error recovery procedures under a predetermined chained state by predetermined times and executes retry by predetermined times. When the count of the number of retry repetitions exceeds a predetermined value, the program exits from the routine and the count is reported to the system as unrecoverable errors.

When error recovery is successfully completed through a series of the error recovery procedures, it is started to change the chained state of the structures in the tables in steps 506 and 507. In step 506, a present structure N for which retry is successfully completed is extracted from the chain and the forward address of a structure N–1 and the previous address of a structure N+1 are rewritten in order to chain the structure N–1 preceding the extracted structure and the structure N+1 following the extracted structure. Thereby, the structures N–1 and N+1 are directly chained.

Then, in step 507, addresses in the structure are rewritten so that retry is successfully completed and the structure N extracted from the chain is located at the head of the chain. That is, to make the structure N present in front of a structure S which has been located at the head of the chain so far, the previous address of the structure N is used as a start address and the forward address of it is used as the address of the structure S which has been located at the head of the chain so far. Moreover, the previous address of the former head structure S is changed from the start address to the address of the structure N.

The error recovery routine terminates after completing these processings. In the next error recovery procedure after the above rewrite is executed, error recovery processings are executed in the sequence following a new chained relation in which rewrite is executed.

Figure 6:
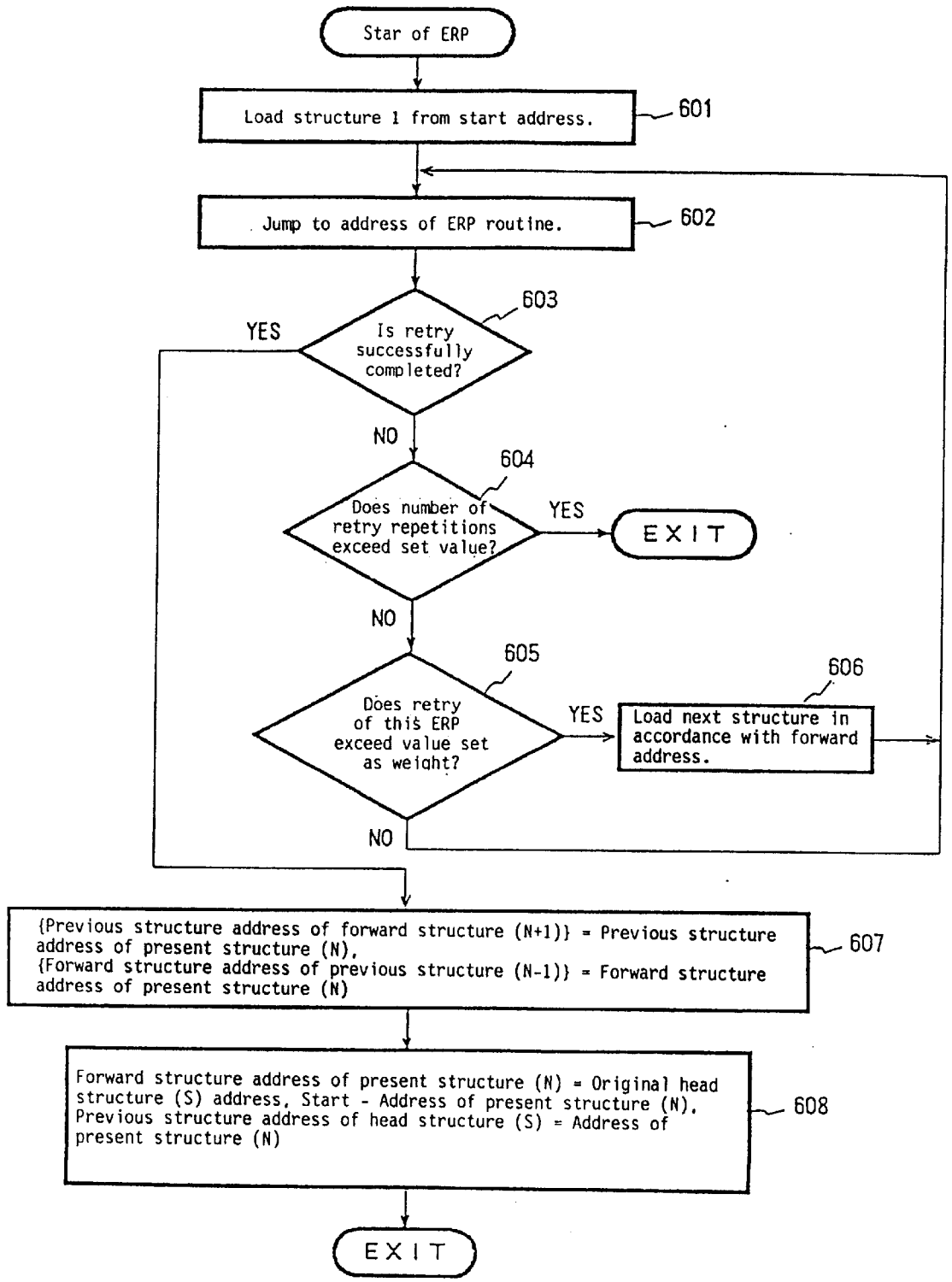
FIG. 6 is an illustration showing the flow for executing an error recovery procedure and rewriting the procedure execution sequence in accordance with the weighting method.

A method for executing the rewrite of an ERP table by means of weighting is described below by referring to FIG. 6. Steps 601 to 604 are the same as steps 501 to 504 in FIG. 5. In step 605 next to step 604, retry count values are compared with intrinsic set values respectively. An intrinsic value is set to each procedure in the ERP procedure and the intrinsic value is compared with the actual number of retry repetitions of each procedure. In this case, when the actual number of retry repetitions exceeds an intrinsic value, the execution sequence is rewritten in steps 607 and 608. Steps 607 and 608 are the same as steps 506 and 507 in FIG. 5. That is, in the flow in FIG. 6, each error recovery procedure is weighted and the actual number of retry repetitions for starting rewrite differs depending on the weighting.

Figure 7:
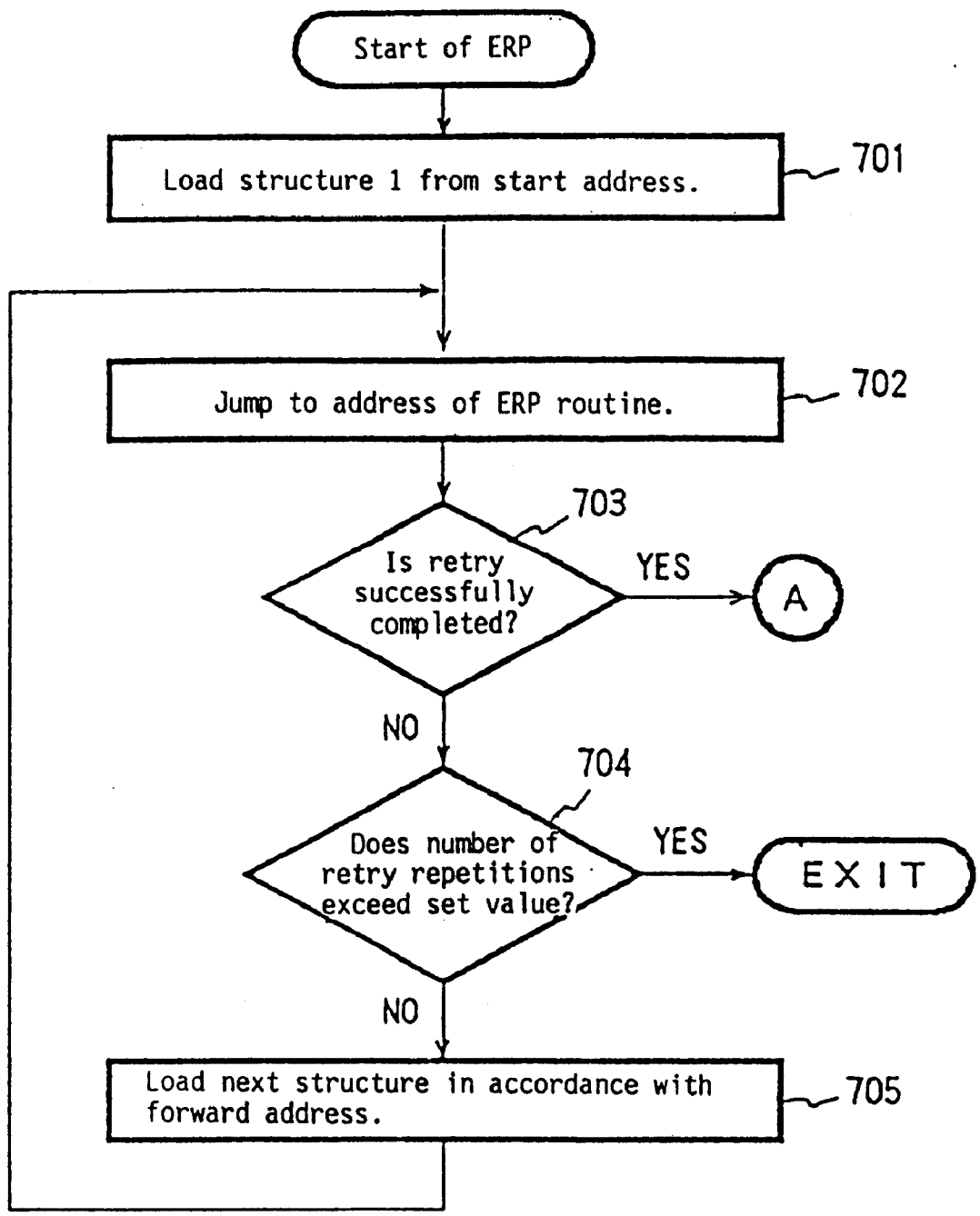
FIG. 7 is an illustration showing part 1 of the flow for executing an error recovery procedure and rewriting the procedure execution sequence in accordance with the retry success counting method.
Figure 8:
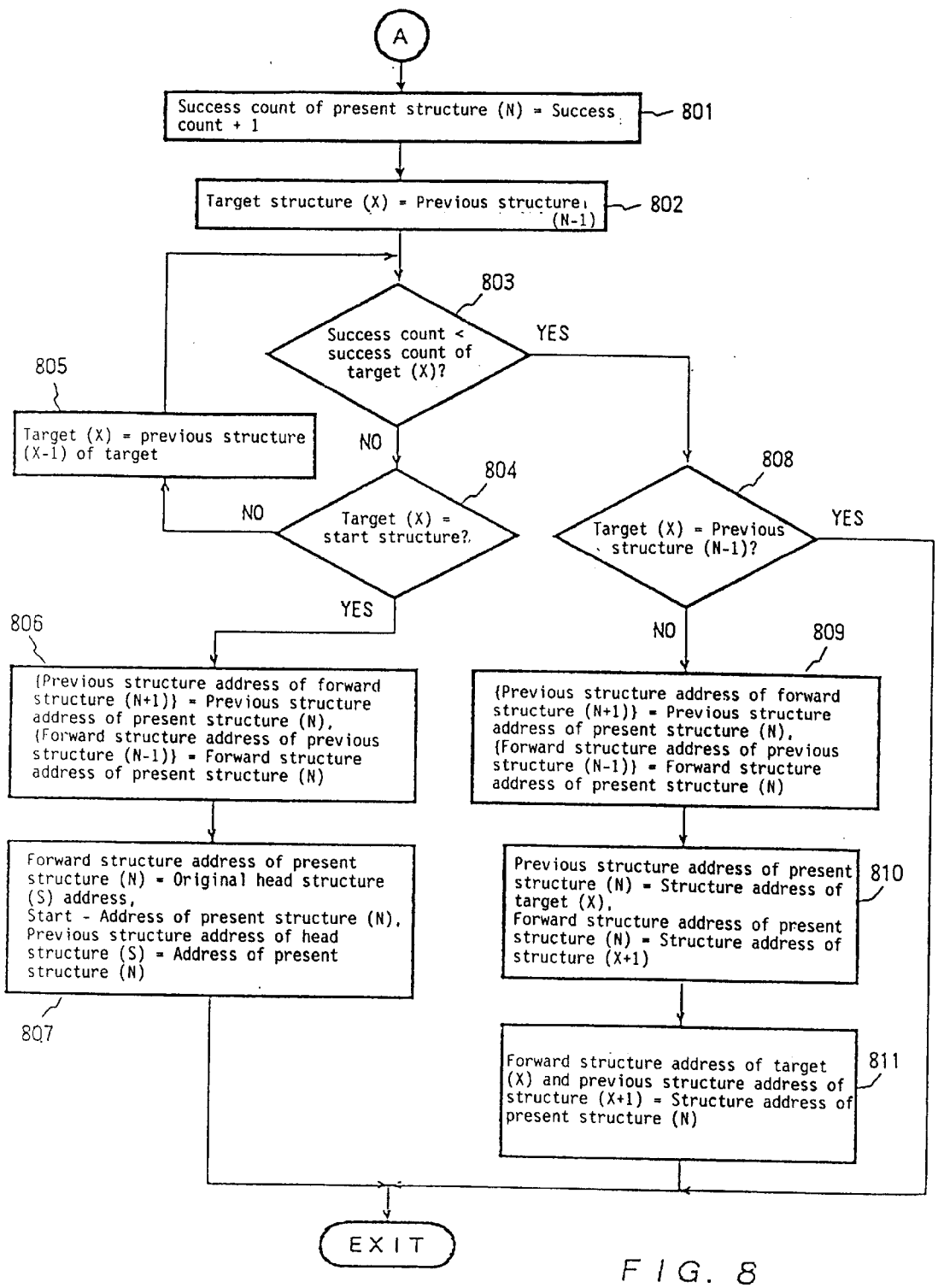
FIG. 8 is an illustration showing part 2 of the flow for executing an error recovery procedure and rewriting the procedure execution sequence in accordance with the retry success counting method.

FIGS. 7 and 8 show flows constituted so as to improve the ERP efficiency by recording the number of successful retry repetitions for each ERP, rewriting the number in a descending sequence, and thereby preferentially executing an ERP with actual results. Steps 701 to 705 in FIG. 7 correspond to steps 501 to 505 in FIG. 5.

When retry is successfully completed because the error is recovered in step 703, the flow in FIG. 8 is started. In step 801, the success count is incremented (increased) by 1. In step 802, a previous structure is selected as a comparison target structure. In step 803, the success count of the present structure (N) incremented by 1 in step 801 is compared with the success count of the previous structure (N–1) selected as a comparison target structure. When the success count of the present structure is smaller than that of the previous structure, that is, in the case of YES, the program advances to step 808. In the case of NO in step 803, that is, when the success count value of the present structure is larger than the success count of the previous structure, it is checked in step 804 if the present target structure (X) is a start structure. If No, a structure (N–2) before the previous structure is selected as a target structure in step 805 and moreover, the success count value of the structure (N–2) is compared with the success count value of the present structure (N). This operation is sequentially repeated until a previous structure having a success count value larger than the success count value of the structure (N) is found. When the target is the first start structure in step 804, the table using the present structure (N) as a start structure is rewritten in steps 806 and 807.

When it is judged in step 803 that the success count value of the present structure (N) is smaller than the target, the program advances to step 808 where it is judged whether the target is a previous structure. When the target is the previous structure (N–1), the program exits from the flow because it is judged that retry success values are still arranged in a descending sequence.

When it is judged in step 808 that the target structure is a structure before the previous structure (N–1), that is, the judgement result in step 808 is No, the table is rewritten in steps 809 to 811. In step 809, the present structure (N) is extracted from the chain, the previous structure address of the forward structure (N+1) is used as the address of the previous structure (N–1), and the forward structure address of the previous structure (N–1) is used as the address of the forward structure (N+1).

In step 810, the structure (N) extracted from the chain is incorporated into a position next to the target structure (X). That is, step 810 is a step for forming a structure (new:X+1), in which the previous structure address of the present structure (N) is used as the address of the target structure (X) and the forward structure address of the present structure (N) is used as the forward structure address (old: X+1) of the target structure (X).

In step 811, the forward structure address of the target structure (X) and the previous structure address of the original X+1 structure, that is, the structure (old:X+1) is used as the address of the present structure (N) and the structure (N) is incorporated into a position next to the target structure (X).

The ERP table is rewritten by the above procedure and the execution sequence of error recovery procedures is changed. It is also possible to rewrite the table by simultaneously using the flows following the success count values shown in FIGS. 7 and 8 and the weighting shown in FIG. 6 and thereby comparing the success count of each procedure with the intrinsic value set to each procedure.

According to the present invention, a plurality of error recovery procedures are rewritten into the optimum sequence in the error recovery processing in a disk drive and unnecessary procedures can be decreased, and the actual error recovery processing is improved.

What is claimed is:

1. A signal recording and regenerating apparatus provided with a signal recording and regenerating converter and a signal recording medium, comprising:

means for sequentially executing a plurality of error recovery processings recorded in an error recovery processing routine when a signal read error occurs;

means for determining an execution sequence of said error recovery processings by structuring chains of addresses for calling; and means for changing the execution sequence of said error recovery processings by changing said chain;

wherein said changing said chain is executed by changing weighting for each structure.

2. The signal recording and regenerating apparatus according to claim 1, wherein, as means for determining the execution sequence of said error recovery processings, one structure is assigned correspondingly to each error recovery processing, an address for calling a corresponding error recovery processing, a structure address corresponding to an error recovery processing executed in the previous step, and a structure address corresponding to an error recovery processing to be executed in the forward step are included in each structure, and a table is used in which a plurality of structures corresponding to a plurality of error recovery processings are recorded by including said previous and forward addresses and maintaining the chained relation, and wherein, as means for changing the execution sequence of said error recovery processings, means for rewriting a structure address corresponding to the error recovery procedure executed in the previous step in each of said structures and a structure address corresponding to an error recovery processing to be executed in the forward step in each of said structures is included.

3. The signal recording and regenerating apparatus according to claim 2, wherein said signal recording medium is a magnetic disk and an error recovery procedure for errors which occur in accordance with elapse of time is included in said error recovery processings.

4. The signal recording and regenerating apparatus according to claim 3, wherein a signal regenerating converter in said signal recording and regenerating converter is a magnetoresistive (MR) element and a processing for recovering a thermal asperity which occurs on a magnetic disk in accordance with elapse of time is included in said error recovery processings.

5. The signal recording and regenerating apparatus according to claim 1, wherein said signal recording medium is a magnetic disk and an error recovery procedure for errors which occur in accordance with elapse of time is included in said error recovery processings.

6. The signal recording and regenerating apparatus according to claim 5, wherein a signal regenerating converter in said signal recording and regenerating converter is a magnetoresistive (MR) element and a processing for recovering a thermal asperity which occurs on a magnetic disk in accordance with elapse of time is included in said error recovery processings.

7. An error recovery processing execution sequence change method in a signal recording and regenerating apparatus provided with a signal recording and regenerating converter, a signal recording medium, and means for sequentially executing a plurality of error recovery processings recorded in an error recovery processing routine when a signal read error occurs; wherein, as for said signal recording and regenerating apparatus, one structure is assigned correspondingly to each error recovery processing, an address for calling a corresponding error recovery processing, a structure address corresponding to an error recovery processing executed in the previous step, and a structure address corresponding to an error recovery processing to be executed in the forward step are included in each structure, a table is used in which a plurality of structures corresponding to a plurality of error recovery processings are recorded by including said previous and forward addresses and thereby maintaining the chained relation, and the chained relation between said structures is changed and the error recovery processing execution sequence is changed by rewriting a structure address corresponding to an error recovery processing executed in the previous step and a structure address corresponding to an error recovery processing to be executed in the forward step in each of said structures based on changing of weighting for each structure.

* * * * *